May 6, 1969 KINJI WAKAMIYA 3,442,723

METHOD OF MAKING A SEMICONDUCTOR JUNCTION BY DIFFUSION

Filed Dec. 27, 1965 Sheet 1 of 2

INVENTOR.
Kinji Wakamiya

BY Hill, Sherman, Meroni, Gross & Simpson ATTORNEYS.

INVENTOR.
Kinji Wakamiya

BY Hill, Sherman, Meroni, Gross & Simpson ATTORNEYS

United States Patent Office 3,442,723

Patented May 6, 1969

3,442,723

METHOD OF MAKING A SEMICONDUCTOR JUNCTION BY DIFFUSION

Kinji Wakamiya, Higashimurayama-shi, Tokyo, Japan, assignor to Sony Corporation, Tokyo, Japan, a corporation of Japan Filed Dec. 27, 1965, Ser. No. 516,520
Claims priority, application Japan, Dec. 30, 1964, 39/56
Int. Cl. H01l 7/44
U.S. Cl. 148—186 4 Claims

ABSTRACT OF THE DISCLOSURE

Preparation of transistor for high voltage switching circuits wherein an impurity is diffused into a wafer of one conductivity type to convert its surface into the opposite conductivity type, the wafer is cut to expose an area of the original conductivity, a second impurity is diffused through the exposed area to form a high impurity concentration layer, and another impurity of the opposite conductivity type is diffused into predetermined, discrete areas of the high impurity concentration layer.

This invention relates to a method of making a semiconductor device and more particularly to a method of making an improved transistor for high voltage and high switching operations.

Prior art transistors cannot be used under high voltage conditions because of their low breakdown voltage resulting from shorting between the collector and the emitter, commonly referred to as a "punch through" phenomenon which is likely to occur due to contact of the depletion region of the collector with that of the emitter in reverse biased condition. According to this invention a high-speed switching transistor can be produced which is high in breakdown voltage but low in base resistance and collector saturated resistance.

Accordingly, it is one object of this invention to provide a high-speed and high voltage switching transistor.

It is another object of this invention to provide a transistor which is low in base resistance and collector saturated resistance.

It is still another object of this invention to provide a transistor comprising a base having a high impurity concentration layer on the surface thereof, an emitter formed in the high impurity concentration layer and a collector whose surface is low in resistivity.

Other objects, features and advantages of this invention will become apparent from the following description taken in conjunction with the accompanying drawings in which.

Referring to FIGURES 1A to 1G, the present invention will be described as applied to the manufacture of an npn-type mesa transistor.

Figures 1A, 1B, 1C, 1D, 1E, 1F, 1G:
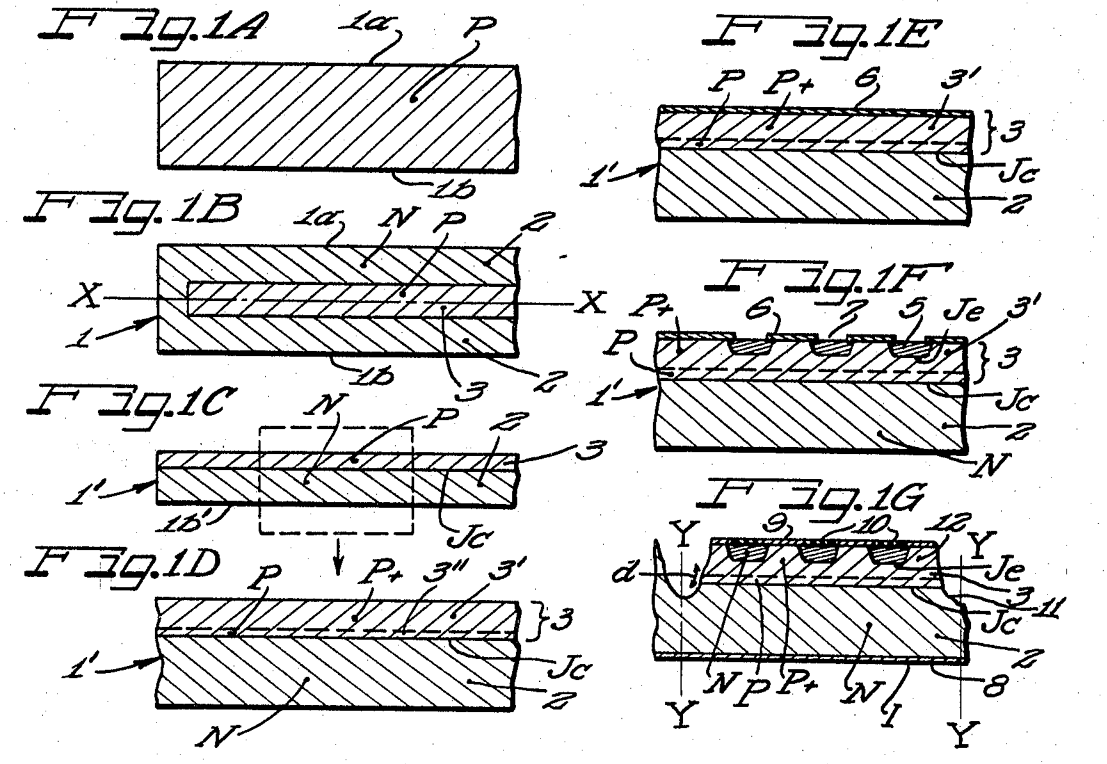
FIGURES 1A to 1G show somewhat schematically the process for the manufacture of a transistor, illustrating one example of the method of this invention.

A p-type semiconductor slice such as a silicon slice 1 is first provided having a thickness of, for example, about 400 microns as shown in FIGURE 1A. The slice 1 is subjected to a solid diffusion treatment of a donor-type impurity such as phosphorus over the entire external surfaces of the slice 1. This produces an n-type region 2 of about 100 to 150 microns in depth surrounding a region 3 of p-type conductivity which will serve as the base of the final transistor, as illustrated in FIGURE 1B.

Next, the slice 1 is cut along the line X—X to remove the upper half portions of the n-type region 2 and the p-type region 3, obtaining a slice 1' consisting of the p-type region 3 and the n-type region 2 as the collector layer in the final transistor having a collector junction *Jc* between the two regions 2 and 3, as depicted in FIGURE 1C. In this case, the thicknesses of the slice 1' and the p-type region 3 are selected respectively in the ranges from about 120 microns to 200 microns and from about 20 microns to 50 microns. The cutting of the slice 1 may be by means of mechanical slicing, polishing or chemical etching.

Then, the surface of the p-type region 3 or the surface 1*a'* of the slice 1' is subjected to a diffusion treatment, forming a surface layer or high impurity concentration layer 3' of graded resistivity as the base of the final transistor, as illustrated in FIGURE 1D. The diffusion is accomplished by contacting the surface 1*a'* of the slice 1' with a vapor of an acceptor-type impurity such as boron. The thickness of the high impurity layer 3' is selected to be about ½ to ⅔ of that of the region 3 so that the high impurity layer 3' does not reach the junction *Jc*.

Following the formation of the high impurity layer 3', n-type regions 5 which are to be emitters are formed at selected areas on the high impurity concentration layer 3' of the p-type region and emitter junctions *Je* are thereby formed. In order to form the regions 5, an oxidized layer 6 of silicon dioxide $SiO_2$ or the like is deposited on the surface 1*a'* of the slice 1' by thermal oxidation, thermal decomposition or vapor deposition as illustrated in FIGURE 1E and some portions of thus deposited layer 6 overlying the areas in which the emitter are to be formed are selectively removed by standard photo masking and etching techniques. Following this, a layer of phosphorus P is selectively diffused into the slice 1' by the use of $P_2O_5$ or the like from the exposed surface 1*a'* of the slice 1' through windows 7 formed by the selective removal of the oxidized layer 6. In this manner the n-type regions 5 are formed having a depth less than the high impurity concentration layer 3', as clearly shown in FIGURE 1F. Next, a conductive layer 8 which is to serve as the collector electrode is deposited on the opposite surface 1*b'* from the surface 1*a'* of the slice 1' or on the collector region 2. Meanwhile, those areas of the oxidized layer 6 which overlie the base layer 3 or the high impurity concentration layer 3' and the emitter layers 5 are selectively removed and then conductive layers 9 and 10 are deposited on the exposed areas of the base layer 3' and the emitter layers 5, thus providing the base and emitter electrodes. Then, the surface 1*a'* of the slice 1' is subjected to mesa-etching to form channels 11 deeper than the junction *Jc*, providing an electrically isolated island commonly referred to as a "mesa." Finally, the resulting structure is cut along the chain lines Y—Y in the channels 11 into individual elements, thus obtaining npn-type mesa transistors T such as illustrated in FIGURE 1G.

Figure 2:
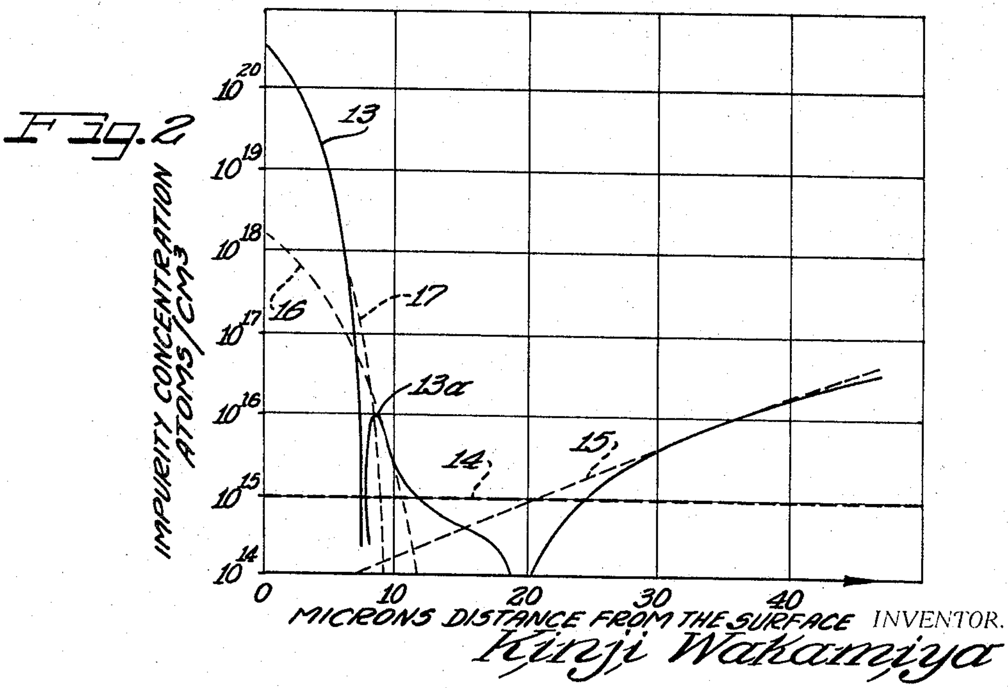
FIGURE 2 is a graph illustrating distribution of impurity concentration of an npn-type transistor produced according to the method illustrated in FIGURES 1A to 1G.

Referring now to FIGURE 2, the characteristics of thus constructed transistor T will hereinbelow be described.

In the graph of FIGURE 2 the full line curve 13 is a distribution curve of the impurity concentration of the transistor T produced according to this invention, the abscissa representing the distance from the surface 1*a'* of the slice 1' and the ordinate the impurity concentration.

The broken line 14 shows initial distribution of the p-type impurity concentration of the slice 1' itself or the impurity concentration of the slice 1' in the case where the collector layer 2 and the high impurity concentration layer 3′ have not yet been provided. The broken line 15 shows the n-type impurity concentration resulting from the impurity diffusion for forming the collector in the process illustrated in FIGURE 1B. Further, the broken line curve 16 shows concentration gradient of the impurity diffusion for forming the p-type high impurity concentration layer 3′ in the base region in the process illustrated in FIGURE 1D. The broken line curve 17 shows concentration gradient of the impurity diffusion for forming the emitter in the process illustrated in FIGURE 1F. Accordingly, the distribution curve 13 of the impurity concentration in the transistor T is composed of the curves 14, 15, 16 and 17.

As is apparent from the curve 13, the transistor T produced according to this invention has a low resistivity, since the collector is high in concentration at the collector junction *Jc*, and its concentration gradient is very slight due to deep diffusion of the collector. Therefore, when a reverse bias is applied to the junction *Jc* its depletion region increases in thickness at the junction, so that the field intensity applied to the junction *Jc* can be reduced and the breakdown voltage of the junction *Jc* can be increased. In this case, the depletion region initially extends toward the base but such extension of the depletion region is prevented at a certain voltage by the high impurity concentration layer 3′, which is formed by double diffusion, namely by the portion of high concentration of the layer 3 such as indicated at 13*a* in FIGURE 2, and as a result the depletion region has to extend toward the collector.

Meanwhile, since the diffusion of the collector region is deep in the transistor according to this invention, irregularity of the junction due to lack in uniform impurity distribution on the surface 1*b* of the slice 1 is unlikely to occur. Therefore, according to this invention transistors for high voltage operation can be produced, coupled with the features described in the foregoing.

Further, the portion of the steep concentration grade in the base immediately below the emitter or that portion which is indicated at 13*a* of the curve 13 serves to prevent the depletion region from extending, as has been described above. In other words, the steep concentration gradient operates to prevent the so-called "punch through" phenomenon or shorting between the collector and the emitter due to contact of the depletion region of the former with that of the latter. At the same time, an acceleraing electric field or a drift field is produced to a minority carrier infused into the base thereby to improve frequency characteristics, especially switching characteristics. In addition, since the base electrode is formed on the high impurity concentration layer 3′ of low resistivity, the base resistance can be reduced.

Moreover, the collector layer 2 is low in impurity concentration at the portion forming the junction *Jc* but high in concentration and low in resistivity at the portion forming the electrode 8 thereon, so that the specific resistivity of the collector layer 3 is low and its collector saturated resistance is also low.

In accordance with method of this invention, the slice 1 is cut off along the section line X—X as illustrated in FIGURE 1B and the base layer 3 is thereby exposed to the surface 1*a*′ of the slice 1′ as illustrated in FIGURE 1C and in this case the thickness of the layer 3 can be selected as desired. As a result of this, the base layer 3 can be made very thin so as to improve the high-frequency characteristics.

Figure 3:
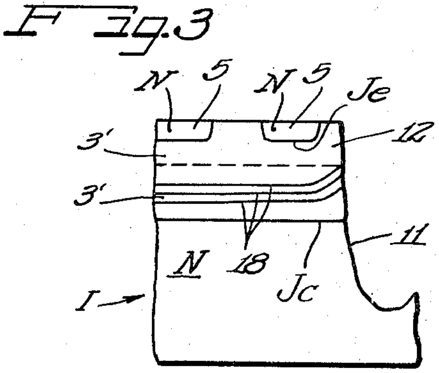
FIGURES 3 and 4 are greatly enlarged cross-sectional views of a transistor for the purpose of explanation of this invention.

In the foregoing example the mesa-etching is carried out after the diffusion of the high concentration layer 3′ over the entire area of the base layer 3 and the resulting structure is then severed to provide individual transistors and as a result the layer 3′ is exposed directly to the channels 11. On the other hand, the specific resistivity of the p-type slice serving as the base sometimes must be increased depending upon the breakdown voltage required for the transistor T. In this case, since the surface of the silicon slice 1 has a tendency to become n-type, the surface of the p-type slice 1 is likely to become p-type of low concentration or the so-called i-type which is neither p- nor n-type, or it may become n-type in some cases. Accordingly, where the high impurity concentration layer 3′ is diffused over the entire area of the base layer 3 as in the foregoing example, the width *d* of the exposed portion of the high resistivity p-type base layer 3″ of relatively low impurity layer 3 becomes as small as 10 to 20 microns after the mesa-etching. Consequently, when a reverse bias is applied between the base and collector electrodes the depletion region of the exposed surface reaches the p-type high impurity concentration layer 3′ more readily than that of the inside as indicated by the solid lines 18 in FIGURE 3. In this case the breakdown voltage of the transistor is inevitably restricted to that of the exposed surface which is lower than that of the inner junction. In addition to this, breakdown is liable to occur at the exposed surface.

Figure 4:
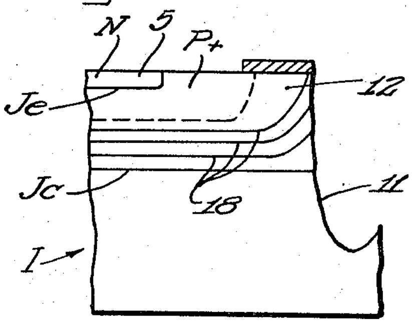

In order to avoid this, the p-type high impurity concentration layer 3′ is diffused selectively on the mesa 12, as illustrated in FIGURE 4, without diffusing the layer 3′ over the entire area of the base layer 3 in the process shown in FIGURE 1D. With this method, it is possible to prevent the depletion region of the exposed surface from reaching the p-type high impurity concentration layer 3′ before the depletion region of the inner junction reaches the p-type high impurity concentration layer 3′. That is, the breakdown voltage of the junction can be increased, and consequently the transistor thus produced can display its feature of the high breakdown voltage, coupled with that of the uniformity in the collector junction.

In the foregoing example illustrated in FIGURES 1A to 1G, inclusive, the present invention has been described in connection with the manufacture of the mesa-type transistor. However, the method of this invention is applicable to the production of the so-called planar-type transistors such that respective junctions are covered with an oxide layer such as silicon dioxide $SiO_2$ or the like.

Referring now to FIGURES 5A to 5G, another example of the present invention will hereinafter be described in connection with the manufacture of the planar-type transistor.

Figure 5A:
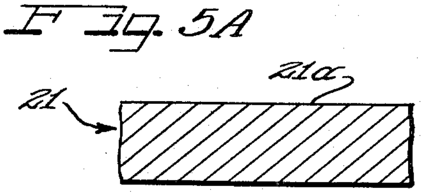
FIGURES 5A to 5G show somewhat schematically a sequence of steps for producing a transistor, illustrating another example of the method of this invention.

A p-type silicon slice 21 is first provided, having a thickness of, for example, about 400 microns, as illustrated in FIGURE 5A.

Figure 5E:
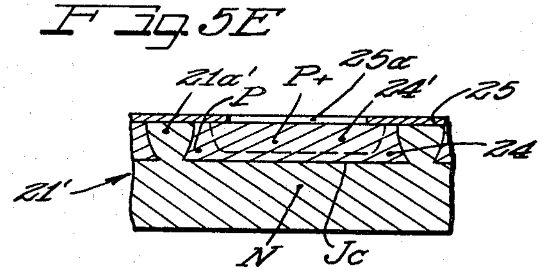
Figure 5B:
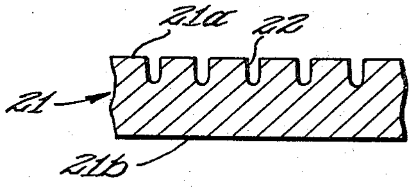

The surface 21*a* of the slice 21 is subjected to mesa-etching to form channels 22 as shown in FIGURE 5B. The depth of the channels 22 is selected to be in the range from, for example, 100 to 150 microns.

Figure 5F:
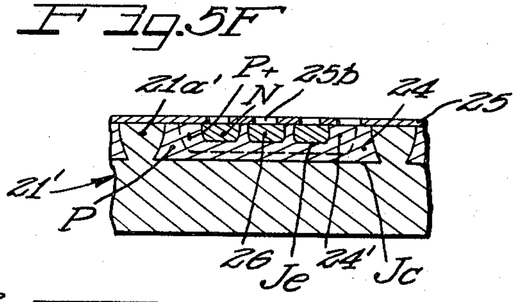
Figure 5C:
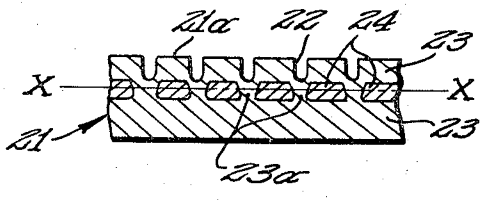

Following this, an n-type impurity is diffused into the slice 21 from both surfaces 21*a* and 21*b* thereof, forming an n-type region which will eventually function as the collector layer, as illustrated in FIGURE 5C. During the diffusion the impurity is also diffused into the slice 21 from the channels 22 so that the n-type region 23 formed on the side of the surface 21*a* and that on the side of the surface 21*b* of the slice 21 are interconnected at the places such as identified by 23*a* corresponding to the channels 22, thereby dividing the p-type region 24 surrounded by the n-type region 23 into a plurality of parts isolated by the portions 23*a*.

Next, the upper half portion of the slice 21 in which the channels 22 have been formed is removed along the line X—X by means of cutting, polishing, etching or the like. That is, the upper half portions of the region 23 and the p-type regions are removed. Thus, a slice 21′ is obtained which has a plurality of p-type regions or base layers 24 formed at a predetermined thickness on the n-type region or collector layer 23 and a collector junction *Jc* therebetween as clearly shown in FIGURE 5D.

Following this, a p-type high impurity concentration layer 24' is formed on each base layer 24 on the slice 21'. The formation of the high impurity concentration layer 24' is carried out in the following manner. That is, an oxide layer 25 such as silicon dioxide $SiO_2$ is deposited on the surface 21*a'* of the slice 21' and one portion of the layer 25 overlying the base layer 24 is removed and then a p-type impurity is diffused through the area indicated at 25*a* from which the layer 25 has been removed. Thus, the p-type high impurity concentration layer 24' is formed as illustrated in FIGURE 5E.

Next, the oxidized layer 25 of silicon dioxide $SiO_2$ or the like is again deposited on the surface 21*a'* of the slice 21' in the same manner as in the foregoing and some portions of the oxidized layer 25 overlying the high impurity concentration layer 24' of the base layer 24 are selectively removed. Then, an n-type impurity is diffused through the areas as identified at 25*b* from which the oxidized layer 25 have been removed, thereby forming n-type regions having a thickness less than the high impurity layer 24' which will eventually serve as the emitters and forming emitter junctions J*e*, as depicted in FIGURE 5F.

Figure 5G:
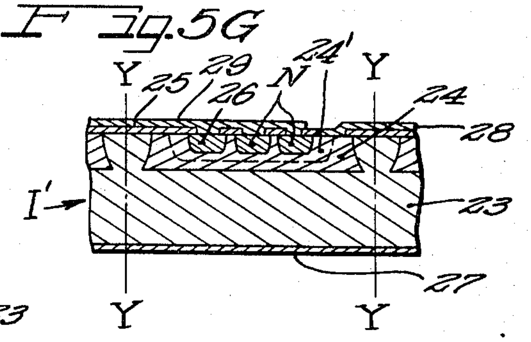
Figure 5D:
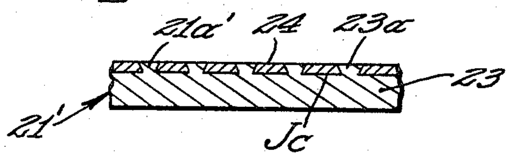

Finally, collector, base and emitter electrodes 27, 28 and 29 are formed on the collector, base and emitter layers 23, 24 and 26 respectively, and the resulting slice 21' is cut along the section line Y—Y, obtaining a transistor T' such as illustrated in FIGURE 5G. The transistor T' is of the so-called planar-type such that the junctions J*c* and J*e* are not exposed directly to the outside and covered with the oxidized layer 25.

The distribution of the impurity concentration in the transistor T' thus obtained is the same as that of the transistor T produced according to the process of FIGURES 1A to 1G, so that its breakdown voltage and high-frequency characteristics can be improved.

Since the junction is covered with the oxidized layer 25, the junction is stable. Further, the distance between the high impurity concentration layer 24' of the base layer 24 and the junction J*c* can be made great, and hence the breakdown voltage of the transistor T' can be improved.

While the foregoing examples deal with the production of npn-type transistors, it will be understood that the present invention may be applied to the production of pnp-type transistors which are high in breakdown voltage and hence suitable for high voltage operation.

It will be apparent that many modifications and variations may be effected without departing from the scope of the novel concepts of this invention.

What I claim is:

1. A method of making a semiconductor device comprising the steps of providing a semiconductor slice of one conductivity type, diffusing an impurity into said slice to convert the conductivity of all of the external surfaces of said slice into the opposite conductivity to a predetermined depth, cutting the slice to expose a region of said one conductivity type, diffusing an impurity into said region to form a high impurity concentration layer of the one conductivity type on the surface of the slice, and diffusing an impurity of said opposite conductivity type into predetermined discreet areas of said high impurity concentration layer.

2. A method of claim 1 including the steps of grooving said slice to form a plurality of channels to a depth less than the p-n junction, and cutting the slice into individual elements.

3. A method of making a semiconductor device as claimed in claim 1 wherein the layer diffused into the high impurity concentration layer is thinner than the high impurity layer.

4. A method of making a semiconductor device as claimed in claim 1 wherein the high impurity layer does not extend to the side of the device.

References Cited

UNITED STATES PATENTS

| | | | |
|---|---|---|---|
| 2,994,054 | 7/1961 | Peterson | 148—33.5 XR |
| 3,089,793 | 5/1963 | Jordan. | |
| 3,104,991 | 9/1963 | MacDonald | 148—188 XR |
| 3,183,128 | 5/1965 | Leistiko | 148—187 XR |
| 3,196,058 | 7/1965 | Webster | 148—33.5 XR |
| 3,200,019 | 8/1965 | Scott | 148—188 |
| 3,236,698 | 2/1966 | Shockley | 14—32.2 XR |

HYLAND BIZOT, *Primary Examiner.*